United States Patent
Sone

(10) Patent No.: US 8,113,560 B2
(45) Date of Patent: Feb. 14, 2012

(54) MOUNTING APPARATUS AND METHOD

(75) Inventor: Shunsuke Sone, Kawaski (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/008,276

(22) Filed: Jan. 18, 2011

(65) Prior Publication Data

US 2011/0174941 A1 Jul. 21, 2011

(30) Foreign Application Priority Data

Jan. 21, 2010 (JP) ................... 2010-010728

(51) Int. Cl.
*A47J 45/00* (2006.01)

(52) U.S. Cl. ........................................ 294/183

(58) Field of Classification Search .................. 294/183, 294/186, 189, 65; 269/21; 414/627, 737, 414/752.1; 901/40
See application file for complete search history.

(56) References Cited

U.S. PATENT DOCUMENTS

| | | | | |
|---|---|---|---|---|
| 2,557,260 A | * | 6/1951 | Clark | 294/183 |
| 2,997,900 A | * | 8/1961 | Pugsley | 451/340 |
| 5,029,383 A | * | 7/1991 | Snyder et al. | 294/183 |
| 5,125,152 A | * | 6/1992 | Grasmueller et al. | 294/183 |
| 5,194,105 A | * | 3/1993 | Nguyen | 294/183 |
| 6,154,954 A | * | 12/2000 | Seto et al. | 294/183 |
| 6,240,628 B1 | * | 6/2001 | Yoshida et al. | 294/183 |
| 6,485,009 B2 | * | 11/2002 | Kashiwazaki et al. | 269/21 |
| 6,663,092 B2 | * | 12/2003 | Kashiwazaki et al. | 269/21 |
| 6,820,325 B2 | * | 11/2004 | Gieskes et al. | 294/183 |
| 6,851,914 B2 | * | 2/2005 | Hirata | 294/183 |
| 7,618,074 B2 | * | 11/2009 | Zimmer | 294/183 |

FOREIGN PATENT DOCUMENTS

| | | |
|---|---|---|
| JP | 8-17872 A | 1/1996 |
| JP | 10-22306 | 1/1998 |
| JP | 10-173007 A | 6/1998 |
| JP | 2000-311906 A | 11/2000 |
| JP | 2001-135649 A | 5/2001 |

* cited by examiner

*Primary Examiner* — Paul T Chin
(74) *Attorney, Agent, or Firm* — Fujitsu Patent Center

(57) ABSTRACT

A mounter apparatus includes a first block disposed so as to be able to be reciprocated by an actuator in a first direction, the first block has a conical hole having a conical internal wall and an axis parallel to the first direction, a second block disposed so as to face the first block and is held by the first block with an elastic body interposed between the first block and the second block, the second block moving by the actuator together with the first block in the first direction, the second block approaching the first block while compressing the elastic body, the second block moving away from the first block due to an elastic force of the elastic body, and a suction head portion rotatably held by the second block and has a suction nozzle on the opposite side from the side where the first block is disposed.

6 Claims, 20 Drawing Sheets

MOUNTING APPARATUS AND METHOD

CROSS-REFERENCE TO RELATED APPLICATIONS

This application is based upon and claims the benefit of priority of the prior Japanese Patent Application No. 2010-10728, filed on Jan. 21, 2010, the entire contents of which are incorporated herein by reference.

FIELD

The embodiments discussed herein are related to a mounting apparatus and a mounting method.

BACKGROUND

Apparatuses described in Japanese Laid-open Patent Publication No. 8-17872 and Japanese Laid-open Patent Publication No. 2001-135649 suction the upper surface of a part with a suction nozzle to hold the part. For this purpose, the apparatuses are provided with a tube used for suction.

When a heat spreader is attached to the upper surface of a chip, sometimes the resulting upper surface is not parallel to the lower surface. In addition, depending on the adhesive used for attaching the heat spreader, the inclination of the upper surface to the lower surface differs from chip to chip.

The apparatuses described in the above patent documents can suction and move a part the upper and lower surfaces of which are not parallel.

However, the apparatuses described in the above patent documents are prevented from returning the suction nozzle to the reference state (return to horizontal position) by the influence of the tube eccentrically attached to the suction nozzle and the influence of the weight and tension of the tube itself. If the operation to suction a part is repeated without returning to the horizontal position, the inclination of the suction nozzle accumulates. If the inclination of the suction nozzle accumulates, the suction nozzle cannot follow the inclination of the upper surface of the part because of the position of the center of gravity. If the suction nozzle comes into contact with the part when the suction nozzle cannot follow the inclination of the upper surface of the part, the suction nozzle cannot produce a vacuum and fails to suction the part. In addition, a point load acts on the part and breaks the part.

The present invention returns a suction nozzle of a mounter apparatus to the reference state every time the operation to move a part is completed.

SUMMARY

According to an embodiment, a mounter apparatus includes a first block disposed so as to be able to be reciprocated by an actuator in a first direction, the first block has a conical hole having a conical internal wall and an axis parallel to the first direction, a second block disposed so as to face the first block and is held by the first block with an elastic body interposed between the first block and the second block, the second block moving by the actuator together with the first block in the first direction, the second block approaching the first block while compressing the elastic body, the second block moving away from the first block due to an elastic force of the elastic body, a suction head portion rotatably held by the second block and has a suction nozzle on an opposite side from a side where the first block is disposed, an immobilizing mechanism immobilizing the suction head portion and stops the rotational operation of the suction head portion, a taper block having an external wall having a conical shape corresponding to the shape of the internal wall of the conical hole, the taper block placed in the conical hole, and a flexible connecting member connecting the suction head portion and the taper block.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present invention will be described with reference to the accompanying drawings. Some of the Figures may not be completely drawn to scale. In some of the Figures, details may be omitted. In some sectional views, hatching may be omitted, or each part may not be hatched differently.

Figure 1:
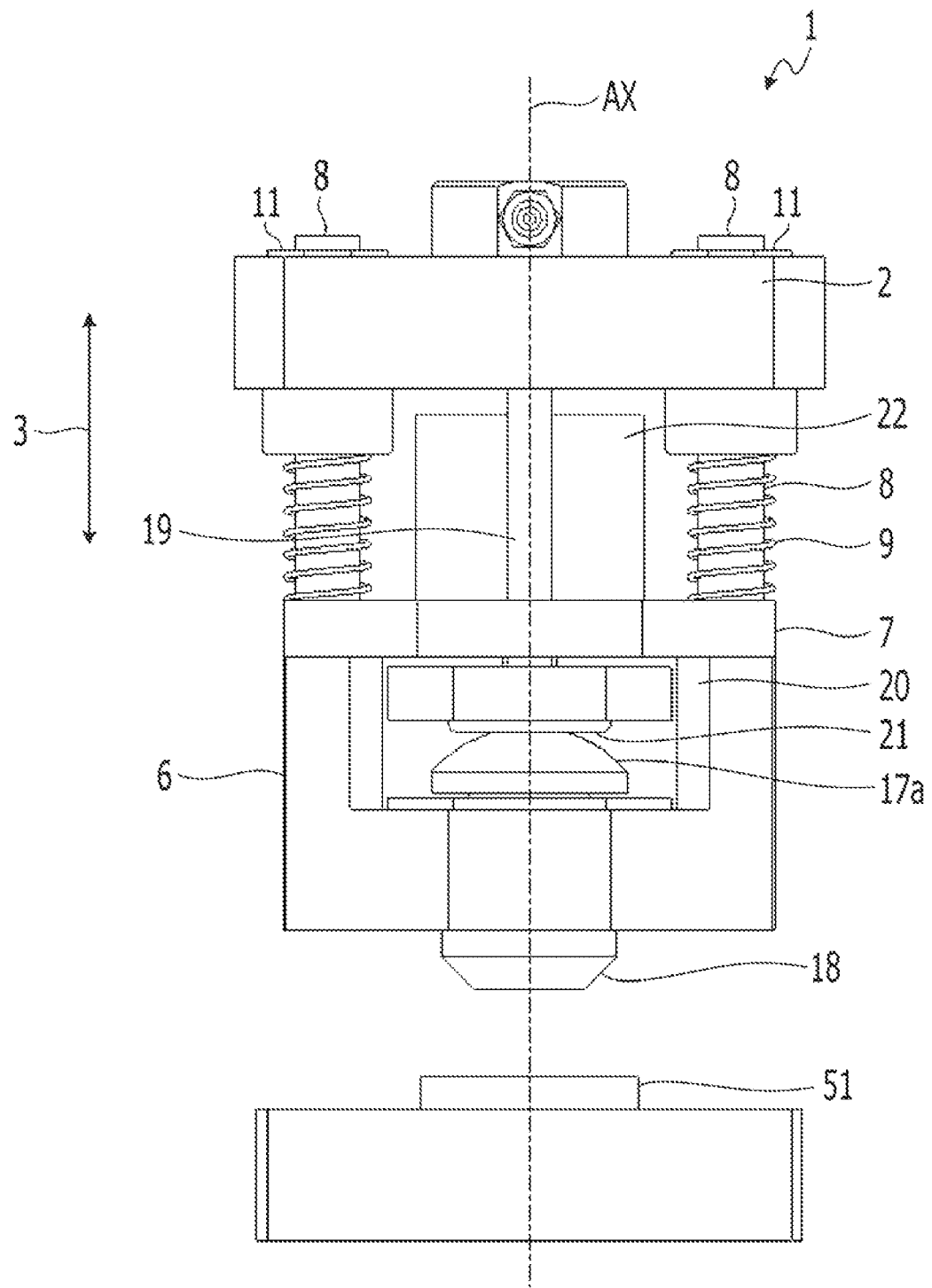
FIG. 1 is a front view of a mounter apparatus of an embodiment.
Figure 2:
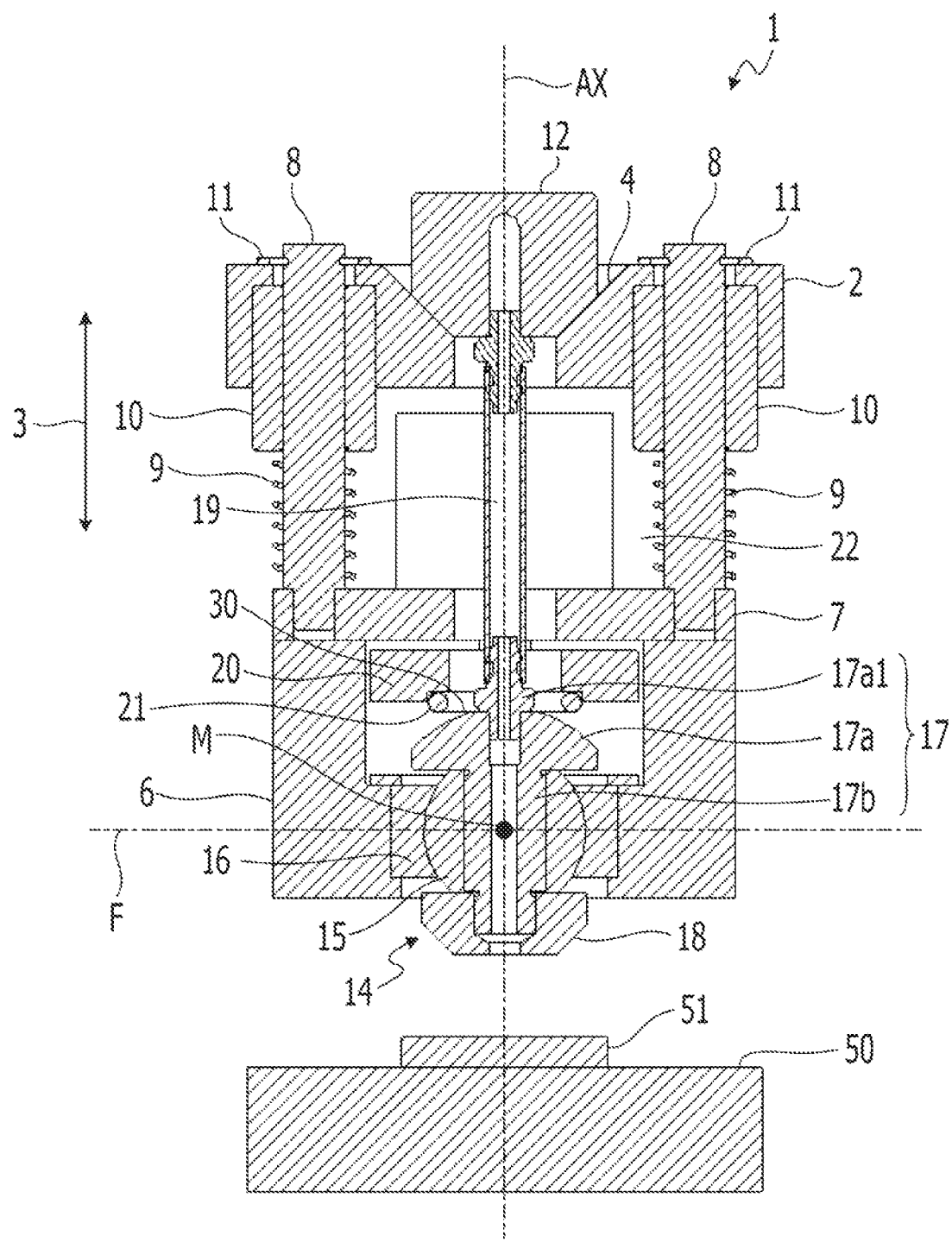
FIG. 2 is a sectional view of the mounter apparatus.
Figure 3:
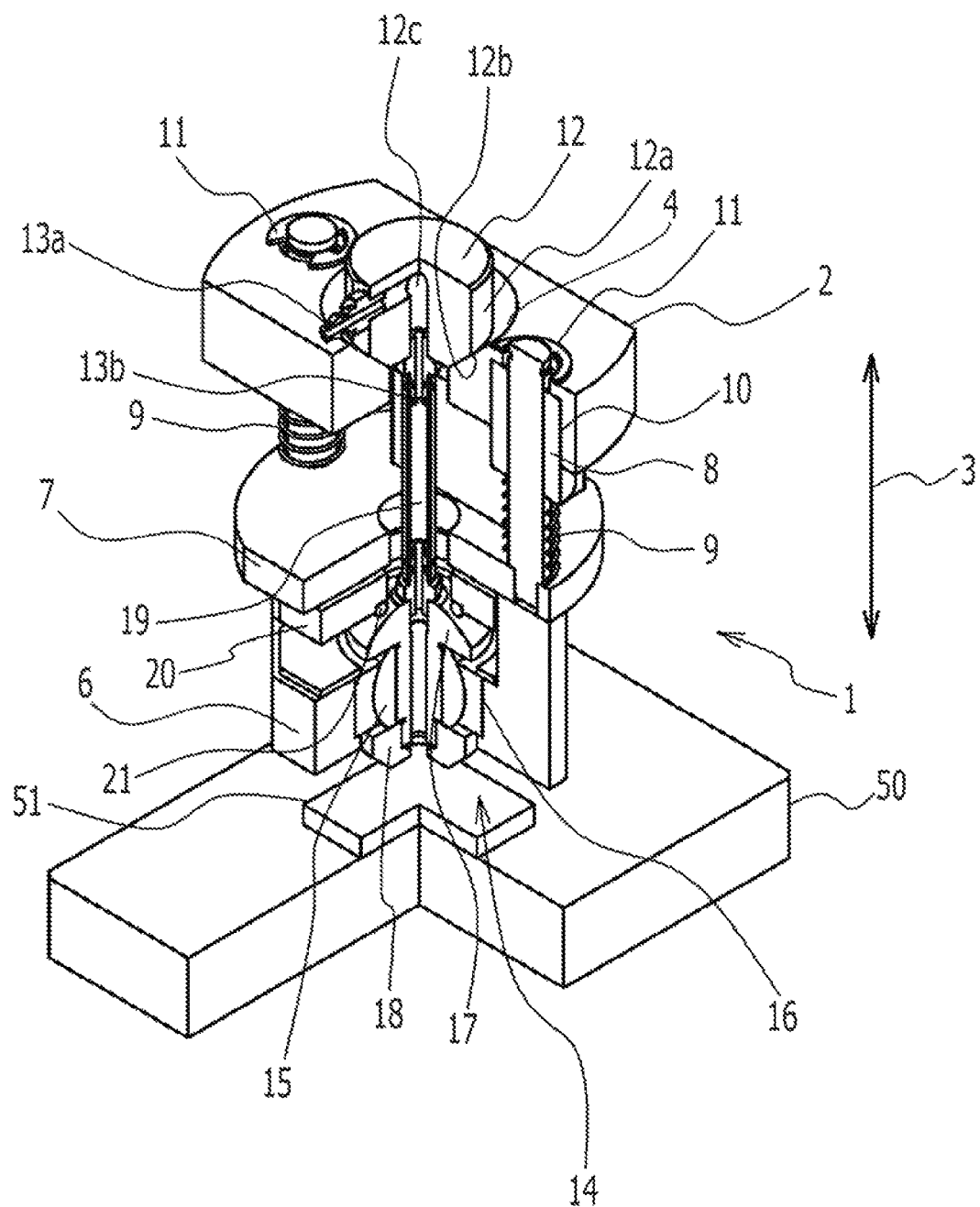
FIG. 3 is a partially cutout perspective view of the mounter apparatus.
Figure 4:
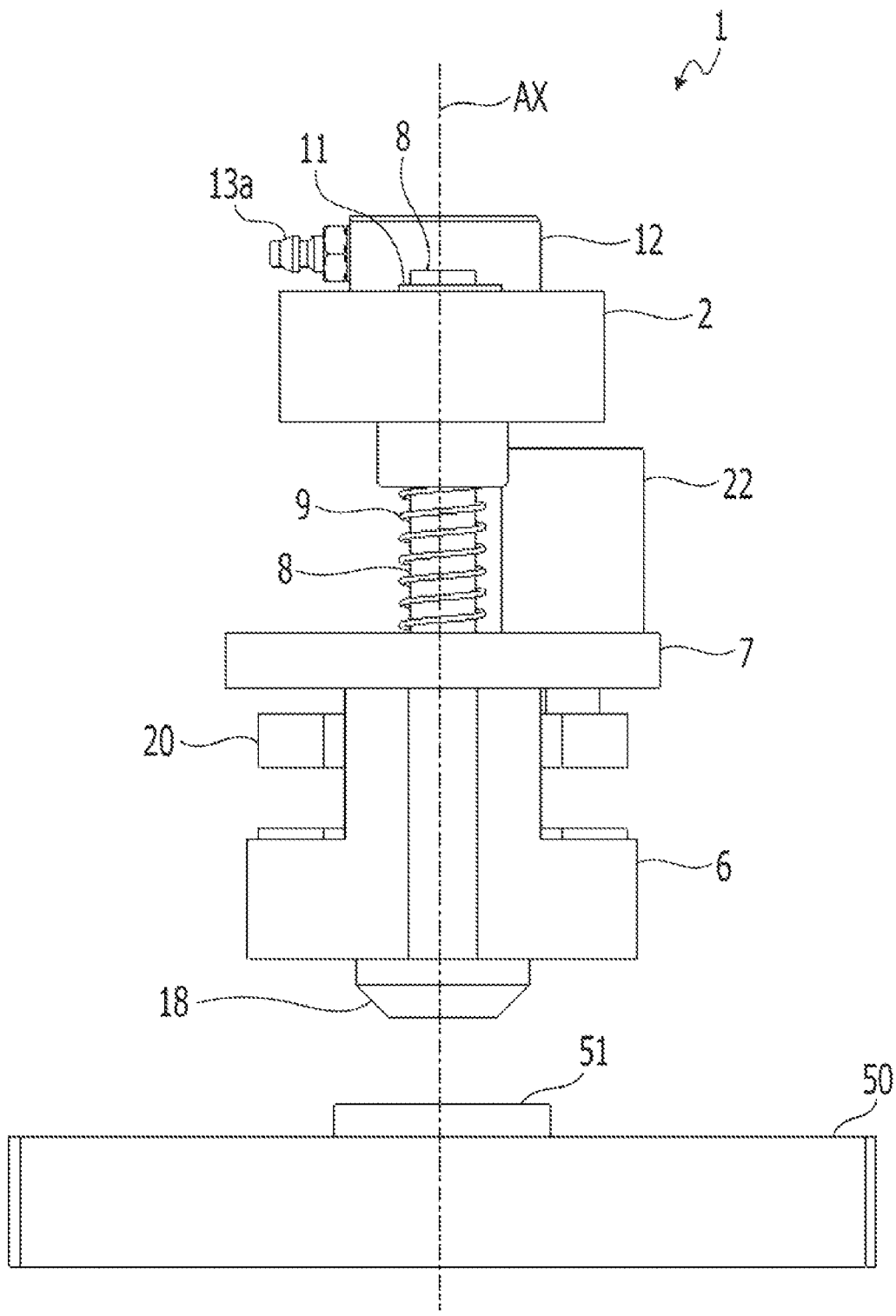
FIG. 4 is a side view of the mounter apparatus.
Figure 5:
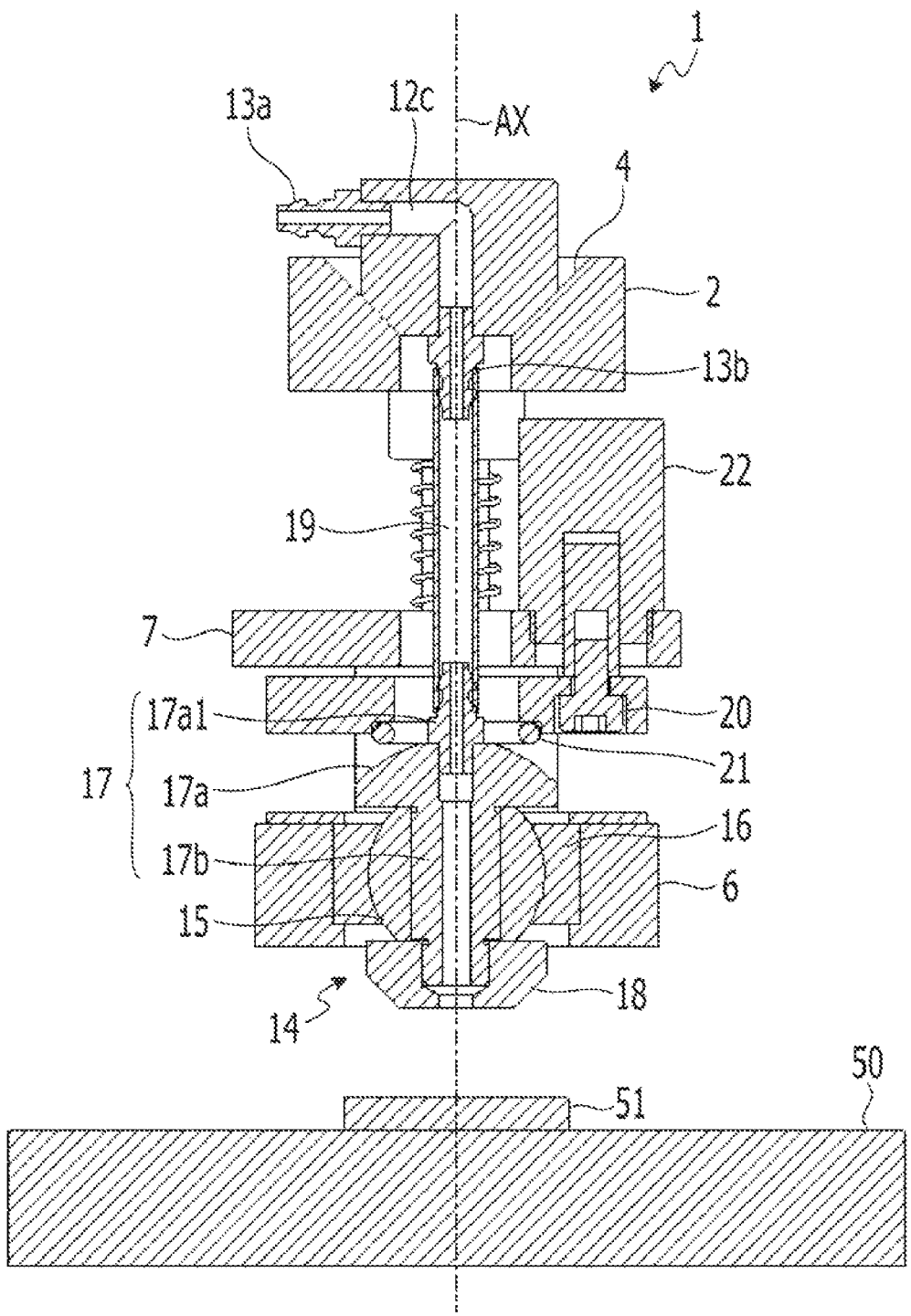
FIG. 5 is a sectional view of the mounter apparatus.
Figure 6:
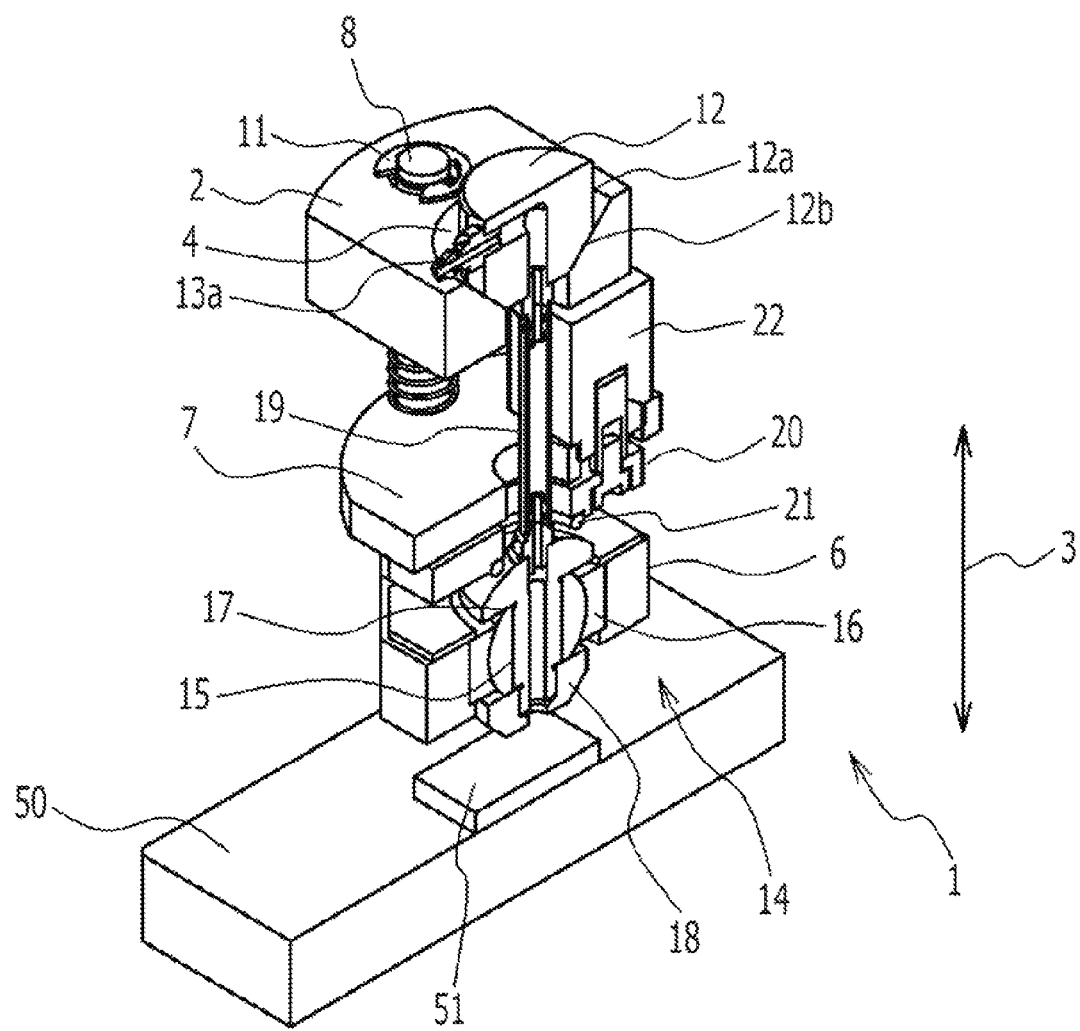
FIG. 6 is a partially cutout perspective view of the mounter apparatus.

A mounter apparatus 1 shown in FIG. 1 has a first block 2 that is disposed so as to be able to be reciprocated by an actuator 5 in a first direction indicated by an arrow 3. The first block 2 has a conical hole 4 that has a conical internal wall as shown in FIGS. 2, 3, and 5. The axis AX of the conical hole 4 is parallel to the first direction indicated by the arrow 3. The first direction is parallel to the vertical direction. The axis AX is also parallel to the vertical direction. The first block 2 has slide bearings 10.

The mounter apparatus 1 has a second block 6 that is disposed so as to face the first block 2 and is held by the first block 2 with springs 9 interposed between the first block 2 and the second block 6. A spring 9 is an example of an elastic body. The mounter apparatus 1 has a connecting block 7 attached to the second block 6 as shown in FIGS. 1 and 2. Two slide shafts 8 are erected on the connecting block 7. That is to say, one ends of the slide shafts 8 are inserted into the connecting block 7 and fixed. The other ends of the slide shafts 8 are passed through the slide bearings 10 of the first block 2. C-shaped washers 11 are attached to the ends of the slide shafts 8 exposed from the slide bearings 10. The second block 6 is held by the first block 2 in this way. The slide shafts 8 are inserted into the springs 9. The springs 9 are sandwiched between the connecting block 7 and the slide bearings 10. The second block 6 and the connecting block 7 may be integrally formed.

The foregoing second block 6 can be moved by the actuator 5 together with the first block 2 in the first direction indicated by the arrow 3. In addition, the second block 6 can approach the first block 2 while compressing the springs 9. That is to say, when the first block 2 is moved by the actuator 5 with the movement of the second block 6 restricted, the first block 2 and the second block 6 approach each other. At this time, the springs 9 are compressed. The second block 6 can be moved away from the first block 2 by the elastic force of the springs 9. That is to say, when the operation of the actuator 5 is stopped with the springs 9 compressed, the first block 2 tries to return to the original position due to the elastic force of the springs 9, and the first block 2 and the second block 6 move away from each other. The springs 9 also function as buffers for overload prevention.

The mounter apparatus 1 has a suction head portion 14. As shown in FIG. 2, the suction head portion 14 has a spherical member 15 and a suction nozzle 18 attached to the spherical member 15. The second block 6 has a holding member 16 that holds the spherical member 15. The spherical member 15 is rotatably held. In this way, the suction head portion 14 is rotatably held by the second block 6. The spherical member 15 has a cavity inside, in which a cap member 17 is fitted. The cap member 17 has a cap portion 17a and a cylindrical portion 17b connected to the cap portion 17a. The cap member 17 is attached to the spherical member 15 by inserting the cylindrical portion 17b into the spherical member 15. The cap member 17 is attached to the spherical member 15 such that the cap portion 17a is located on the side where the first block 2 is disposed. On the opposite side from the side where the first block 2 is disposed, the suction nozzle 18 is provided. The cap member 17 is provided with an air passage for suction. The top portion 30 of the cap portion 17a is provided with a mouth member 17a1 for connecting a suction tube 19. The suction tube 19 is an example of a connecting member that connects the suction head portion 14 and a taper block 12 to be described later, and it has flexibility. The suction tube 19 supplies suction force to the suction head portion 14. The suction tube 19 is formed of a slightly elastic material, such as nylon or polyurethane. The length of the suction tube 19 is determined in accordance with a reference state where the distance between the first block 2 and the second block 6 is maximal. That is to say, the suction tube 19 has such a length that when the distance between the first block 2 and the second block 6 is maximal, the suction tube 19 connecting the suction head portion 14 and the taper block 12 is straight (not bent).

Figure 8:
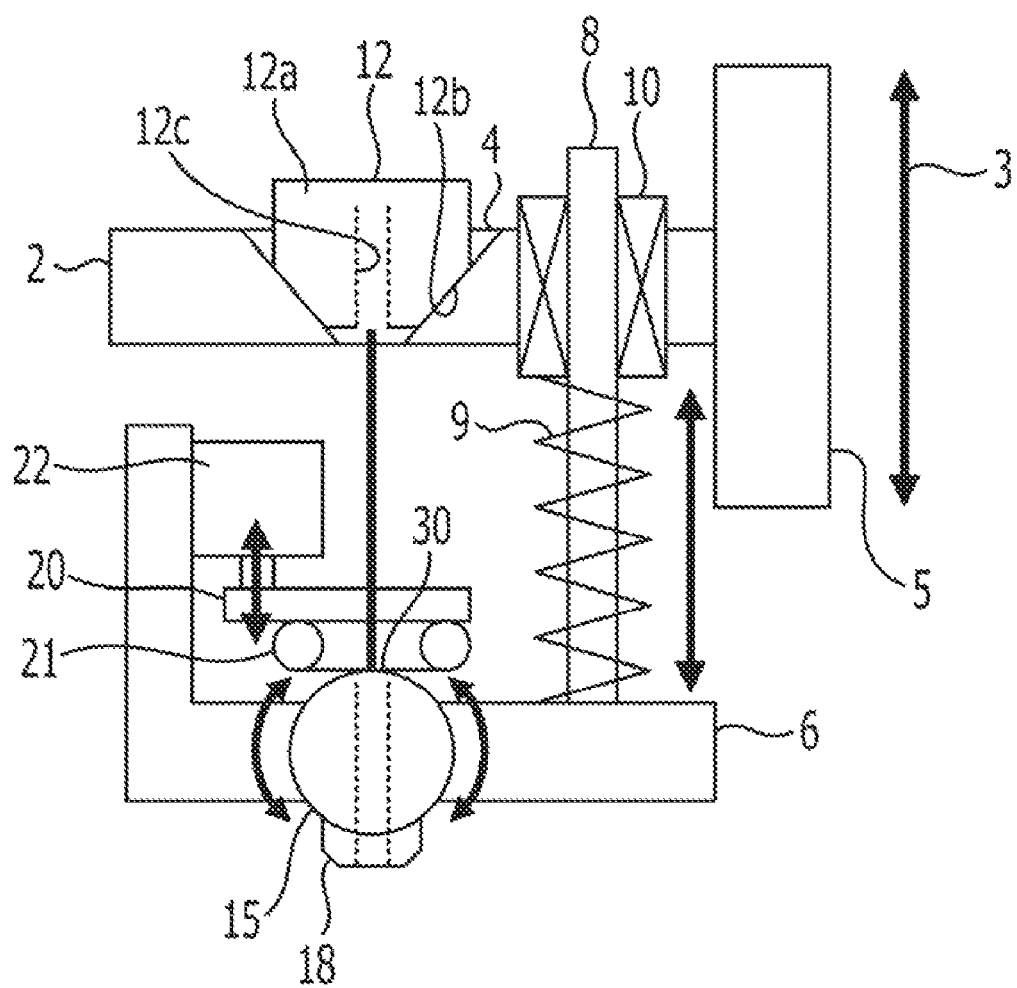
FIG. 8 is a schematic view of the mounter apparatus.
Figure 9:
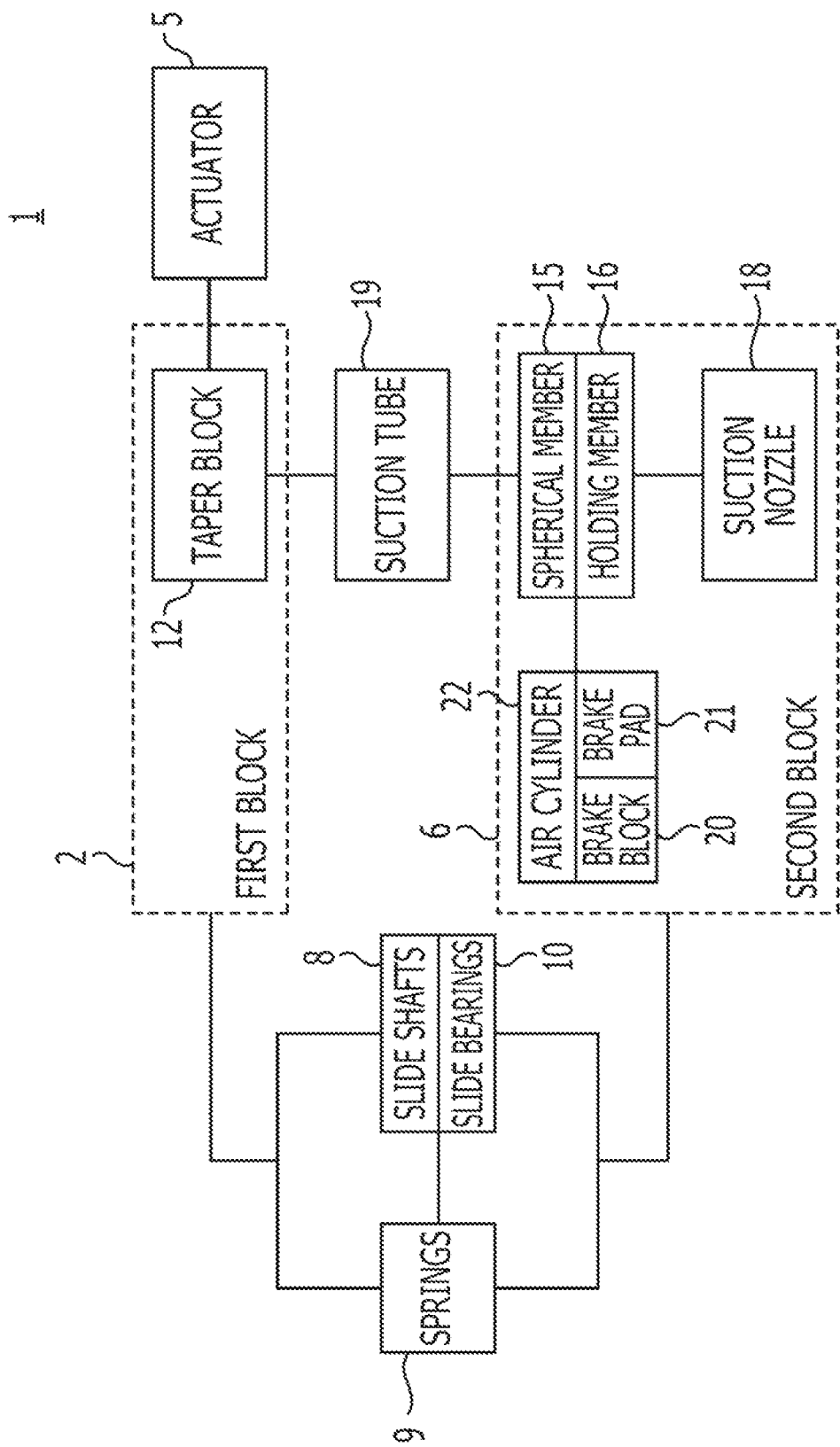
FIG. 9 is a block diagram of the mounter apparatus.

The mounter apparatus 1 has an immobilizing mechanism that immobilizes the suction head portion 14 and stops the rotational operation of the spherical member 15. As shown in FIGS. 2, 8, and 9, the immobilizing mechanism has a brake block 20 and an annular brake pad 21 attached thereto. In addition, the immobilizing mechanism has an air cylinder 22 that drives the brake block 20. The brake pad 21 is formed of an elastic body having a high coefficient of friction. In this embodiment, the brake pad 21 is formed of rubber. The air cylinder 22 is an example of an actuator that drives the brake block 20. Another type of actuator, for example, an oil hydraulic cylinder may be used. Alternatively, an electric motor may be used to drive the brake block 20. The air cylinder 22 moves the brake block 20 in the vertical direction. That is to say, the brake block 20 moves in a direction in which a part (chip 51) is suctioned and locks the suction head portion 14. Thus, the undersurface of the chip 51 can be kept horizontal. That is to say, for example, when lock operation is performed, the chip 51 is not raised slightly, and the undersurface of the chip 51 can be easily kept horizontal.

Figure 7:
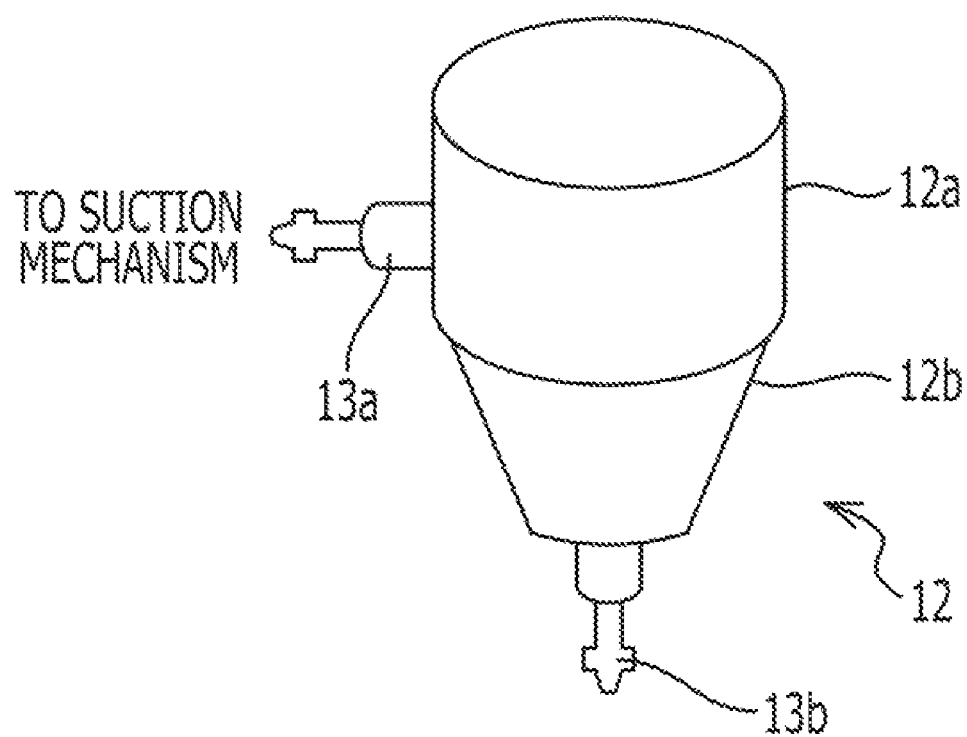
FIG. 7 is a perspective view of a taper block.

The mounter apparatus 1 has a taper block 12. FIG. 7 is a perspective view of the taper block 12. The taper block 12 has a cylindrical portion 12a and an external wall 12b that is connected to the cylindrical portion 12a and has a conical shape corresponding to the shape of the internal wall of the conical hole 4 of the first block 2. The external wall 12b forms a truncated cone. Inside the taper block 12, an air passage 12c is formed. One mouth portion of the air passage is provided in the side wall of the cylindrical portion 12a. The other mouth portion of the air passage is provided in the center of the truncated cone. As shown in FIG. 7, the mouth portions are provided with connecting members 13a and 13b for connecting suction tubes. To the connecting member 13b is connected the suction tube 19. To the connecting member 13a is connected a suction tube that is connected to a pump included in a suction mechanism.

The foregoing taper block 12 is placed in the conical hole 4. The inclination angle of the external wall 12b of the taper block 12 corresponds to the inclination angle of the internal wall of the conical hole 4. Therefore, the taper block 12 can be brought into a seated state where the taper block 12 is in close contact with the internal wall of the conical hole 4. The taper block 12 in the seated state is restricted from moving in the horizontal direction. When the first block 2 and the second block 6 approach each other and the suction tube 19 is bent, the taper block 12 is pushed up by the suction tube 19 and is unseated from the conical hole 4 for an instant. The taper block 12 in the unseated state can move in the horizontal direction.

The position of the center of rotation of the suction head portion 14 in the foregoing mounter apparatus 1 will be described with reference to FIG. 2. The suction head portion 14 has a spherical member 15 rotatably held by a holding member 16 as described above. Inside the foregoing spherical member 15, a center M of rotation is set.

As described above, the first direction in this embodiment is the vertical direction. Assume a plane perpendicular to the vertical direction, that is to say, a horizontal plane F. The center M of rotation is set so as to coincide with the position of the axis AX in the horizontal plane F. The suction tube 19 connects the connecting member 13b provided in the center of the taper block 12 and the top portion 30 of the cap portion 17a included in the suction head portion 14. By setting as described above, the connecting member (suction tube) 19 extends in the vertical direction with the taper block 12 pulled up and the suction nozzle 18 not in contact with the part (chip)

51. Thus, the suction head portion 14 can be returned to the reference state where the suction nozzle 18 faces downwardly.

The mounter apparatus 1 has a sensor that measures the distance between the first block 2 and the second block 6. The sensor is used for acquiring data for calculating the timing to activate the air cylinder included in the immobilizing mechanism and to apply a brake on the suction head portion 14. The foregoing sensor may be a sensor that measures the sliding of the first block 2 relative to the slide shafts 8. The mounter apparatus 1 is connected to a control portion. The operation of the mounter apparatus 1 is controlled by the control portion.

Next, a part mounting method using the above-described mounter apparatus 1 will be described. Here, a description will be given of a method for picking up a part (chip) 51 from a table 50 and placing it on a substrate 52. As shown, for example, in FIG. 11, the upper surface, that is to say, the surface 51a to be suctioned of the chip 51 is inclined. This inclination is caused by bonding a heat spreader to the chip 51.

Figure 10:
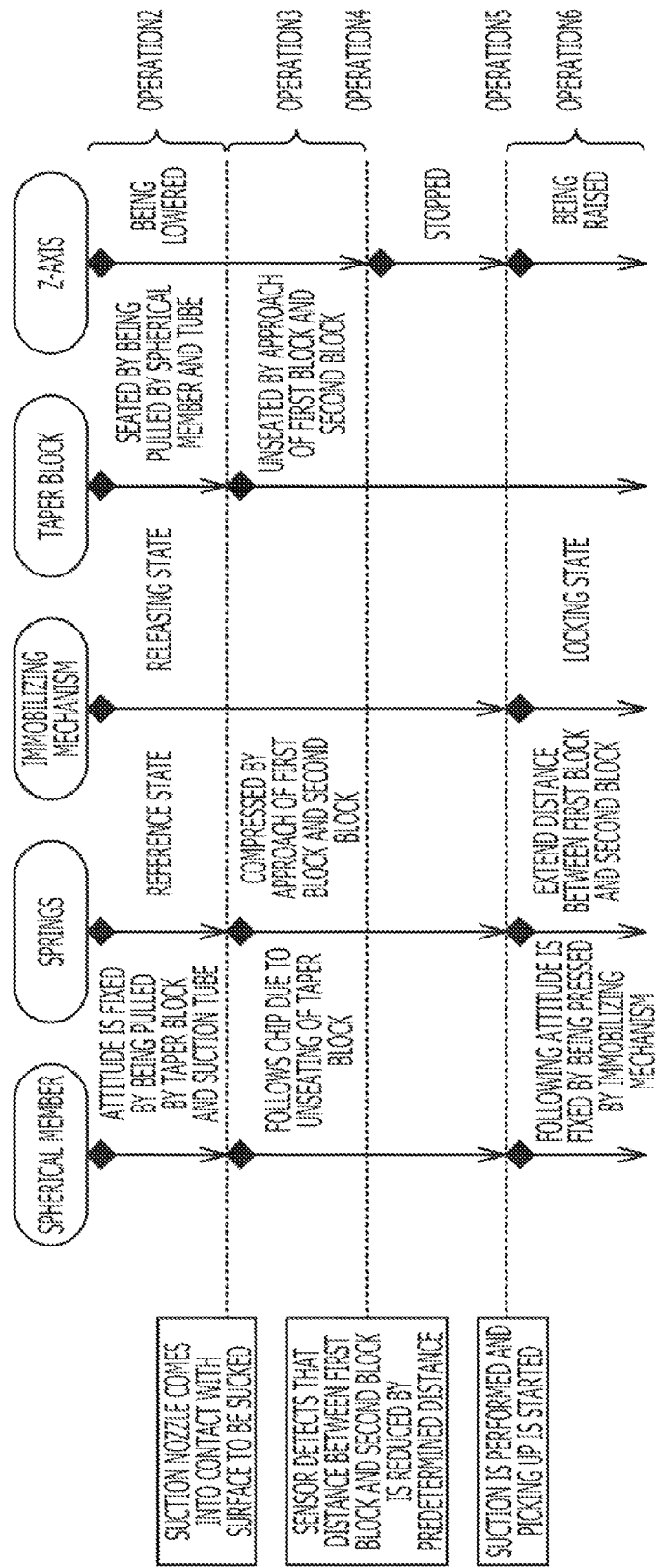
FIG. 10 shows the operation of the mounter apparatus during the suctioning of a chip.

First, the process of suctioning and picking up the chip 51 from the table 50 using the mounter apparatus 1 will be described with reference to a time chart shown in FIG. 10. For the purpose of describing the movements of the mounter apparatus 1, figures schematically showing the mounter apparatus 1, such as FIG. 8, will be used. In FIG. 8, the cap member 17, the holding member 16, and others are omitted.

Figure 11:
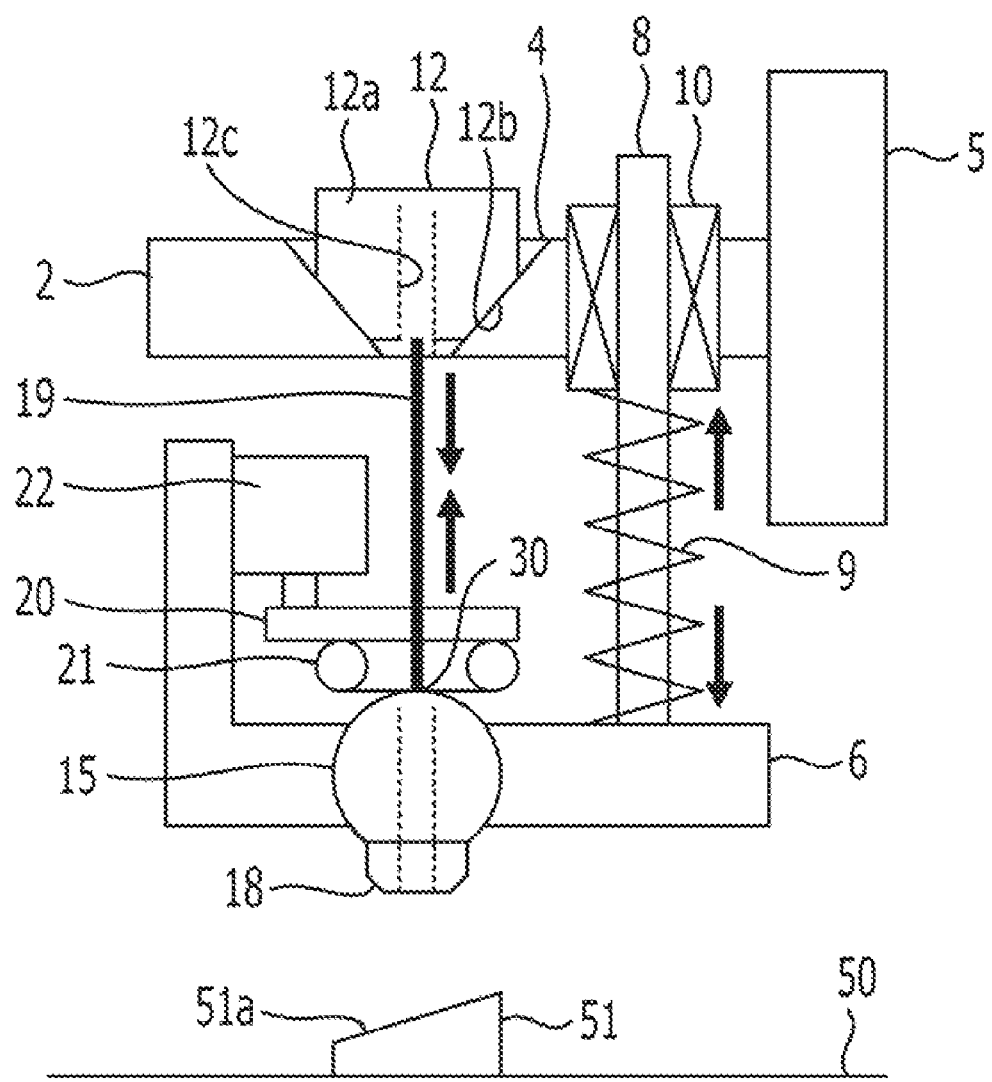
FIG. 11 shows the mounter apparatus on standby for the suctioning of a chip.

The suctioning process is started from a standby state shown in FIG. 11. This state will be referred to as OPERATION 1. In this state, the elastic force of the spring 9 acts so as to move the first block 2 and the second block 6 away from each other, and the distance between the first block 2 and the second block 6 is maximal. The tension of the suction tube 19 acts so as to pull the spherical member 15 and the taper block 12. The spherical member 15 is not immobilized by the immobilizing mechanism. The taper block 12, being pulled by the suction tube 19, is seated in the conical hole 4. The actuator 5 is not activated and does not perform the operation in the vertical direction (Z-axis direction). The state of each part in OPERATION 1 is as described above.

Figure 12:
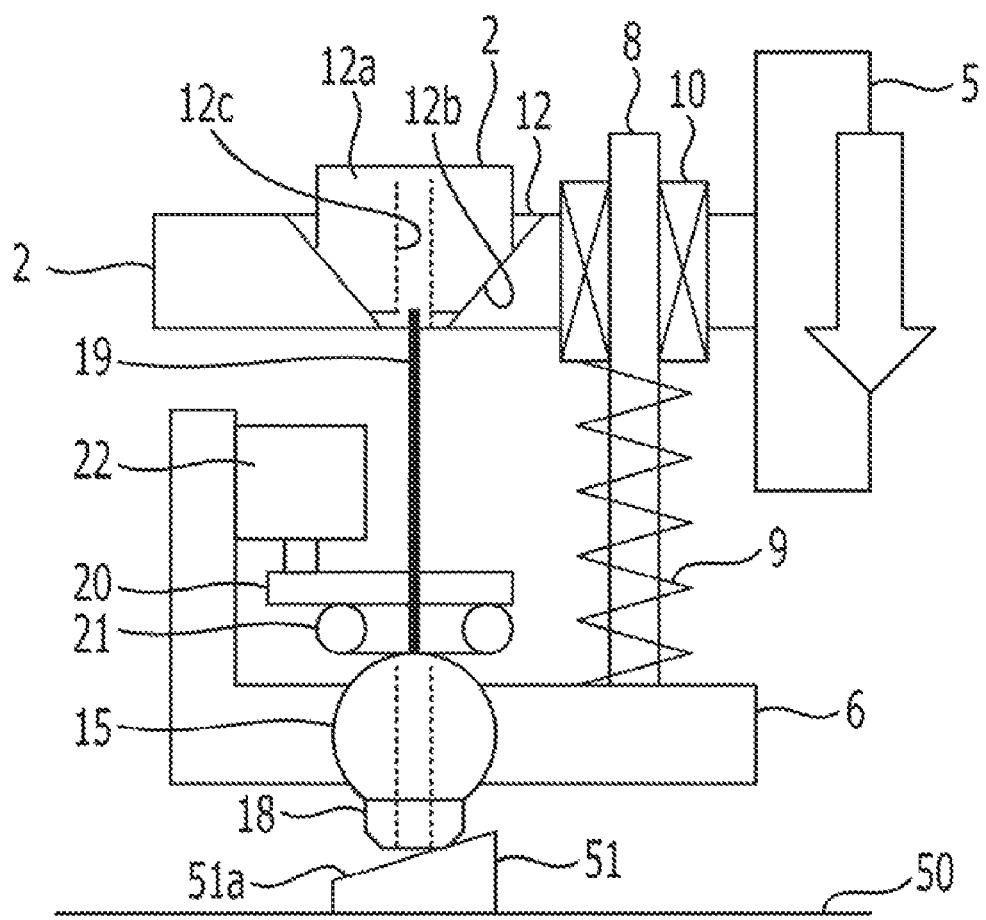
FIG. 12 shows the mounter apparatus the suction nozzle of which is in contact with the surface to be suctioned of the chip.

From the state of OPERATION 1 shown in FIG. 11, the mounter apparatus 1 activates the actuator 5 and lowers the first block 2 (OPERATION 2). At this time, the second block 6 also lowers, while maintaining the distance to the first block 2. Because the second block 6 lowers, the suction nozzle 18 attached to the spherical member 15 held by the second block 6 also lowers. Because the spherical member 15 is pulled by the suction tube 19, the suction nozzle 18 keeps the center position and maintains the vertically downward position. In this way, the mounter apparatus 1 brings the suction nozzle 18 into contact with the surface 51a to be suctioned of the chip 51 from the first direction (vertical direction) with the center position of the suction nozzle 18 kept as shown in FIG. 12. In this state, the elastic force of the spring 9 still balances with the tension of the suction tube 19, and the spherical member 15 cannot rotate.

Figure 13:
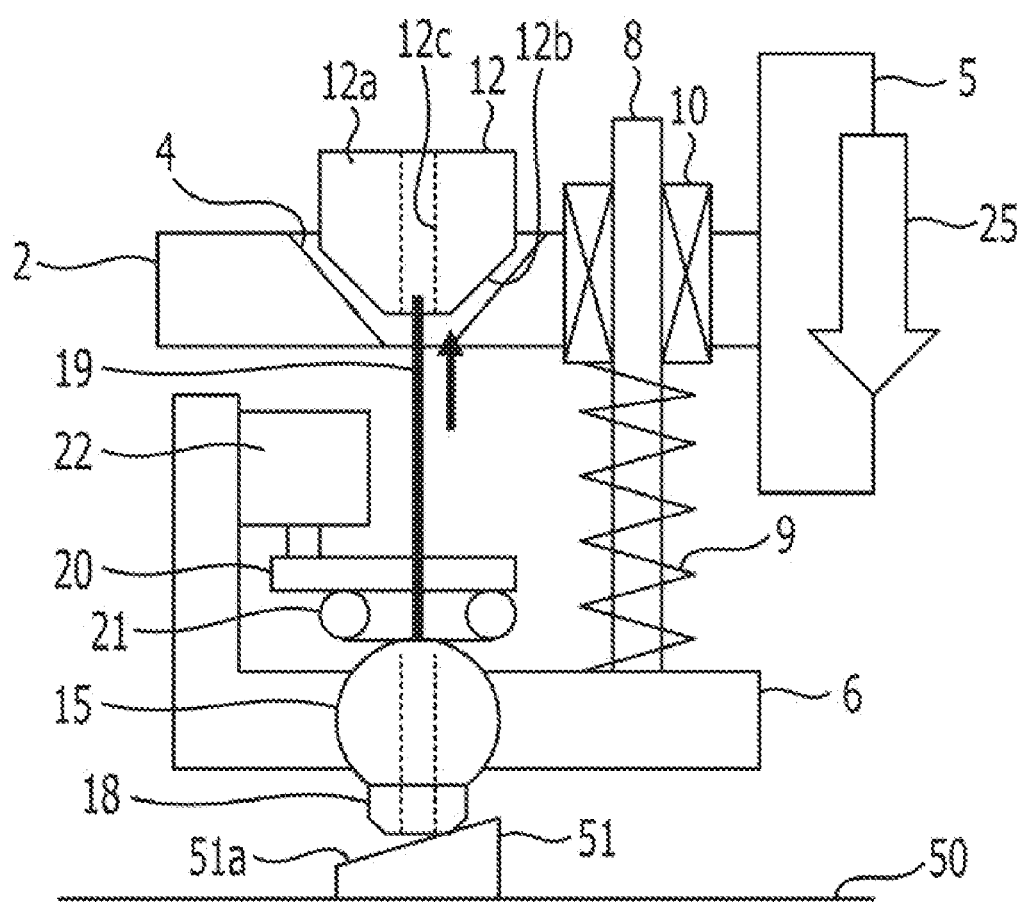
FIG. 13 shows the mounter apparatus the taper block of which is unseated from the first block.
Figure 14:
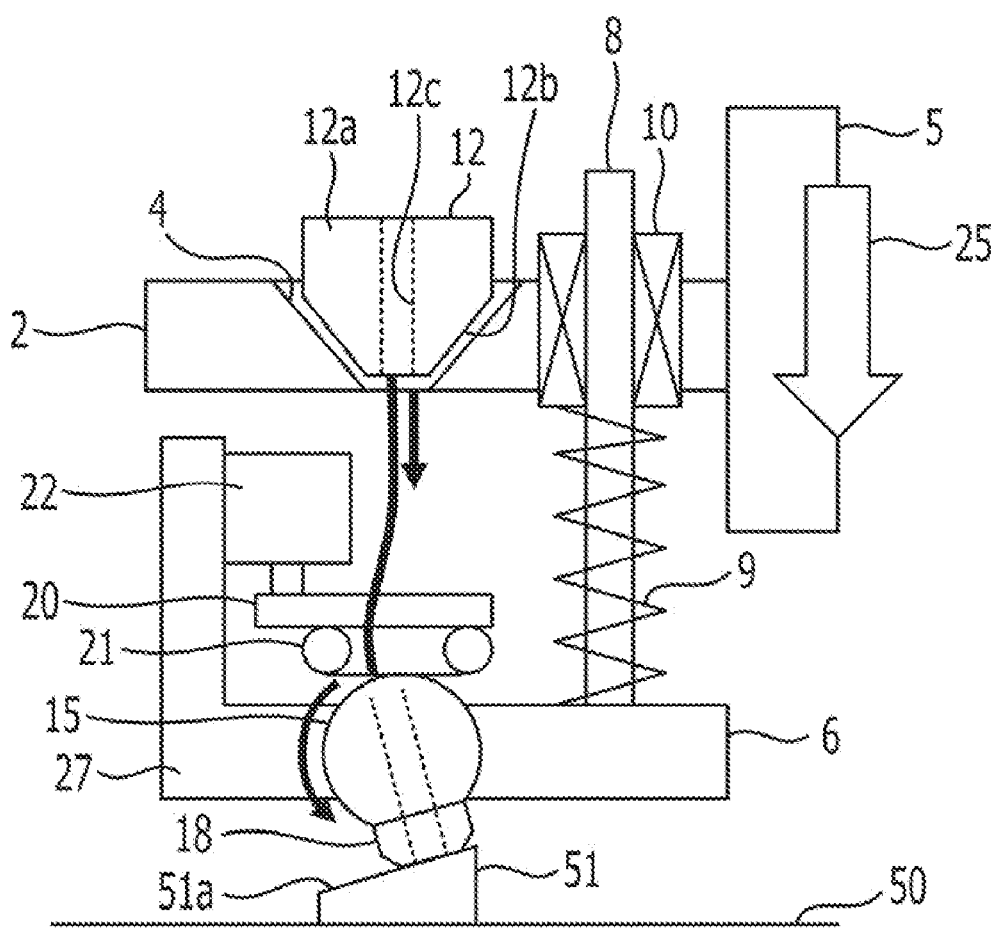
FIG. 14 shows the mounter apparatus the spherical member of which is inclined.

From the state shown in FIG. 12, the mounter apparatus 1 continues the operation of the actuator 5 as indicated by an arrow 25 in FIG. 13. Thus, the first block 2 is moved in the first direction (vertical direction) toward the chip 51. As a result, the spring 9 is compressed and deformed. The spring 9 is compressed and deformed as the distance between the first block 2 and the second block 6 is reduced. When the distance between the first block 2 and the second block 6 becomes shorter than the length of the suction tube 19, the taper block 12 is unseated from the conical hole 4 as shown in FIG. 13. Thus, the spherical member 15 becomes rotatable, and the suction head portion 14 rotates according to the inclination of the surface 51a to be suctioned as shown in FIG. 14. When the inclination of the suction head portion 14 has become equal to the inclination of the surface 51a to be suctioned, OPERATION 3 is completed.

When activating the actuator 5, the mounter apparatus 1 measures the distance between the first block 2 and the second block 6 with a sensor. In this embodiment, when the distance between the first block 2 and the second block 6 is reduced by 2 millimeters (mm) from the reference state, it is determined that the suction nozzle 18 is in close contact with the surface 51a to be suctioned. When it is detected that the distance between the first block 2 and the second block 6 reaches a specified distance (reduced by 2 mm), the state of the actuator 5 is maintained (OPERATION 4). The distance between the first block 2 and the second block 6 is set to a distance long enough for the suction nozzle 18 to follow the surface 51a to be suctioned. The inclination of the surface 51a to be suctioned varies but is within a specified range. So, the above distance is set so that this variation can be covered.

The mounter apparatus 1 then activates the pump included in the suction mechanism and attaches the chip 51 to the suction nozzle 18 of the suction head portion 14 (OPERATION 5).

Figure 15:
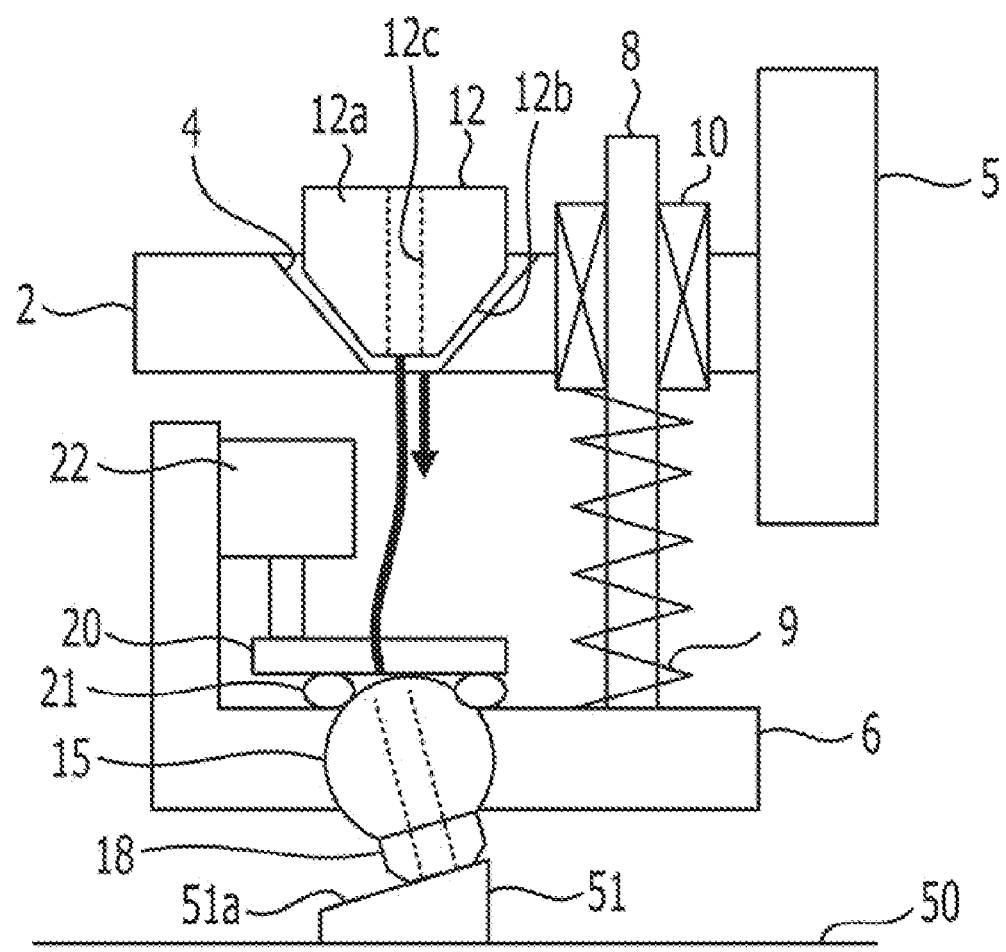
FIG. 15 shows the mounter apparatus in which a brake is put on the inclined spherical member and the spherical member is locked.

After attaching the chip 51, the mounter apparatus 1 activates the immobilizing mechanism, immobilizes the suction head portion 14, and stops the rotational operation of the suction head portion 14 as shown in FIG. 15. More specifically, the air cylinder 22 is activated, the brake pad 21 is pressed against the spherical member 15 (actually the cap member 17), and a brake is put on the spherical member 15 to lock the spherical member 15. After the spherical member 15 is locked, the actuator 5 is raised. At this time, the distance between the first block 2 and the second block 6 is extended by the elastic force of the spring 9 (OPERATION 6).

Figure 16:
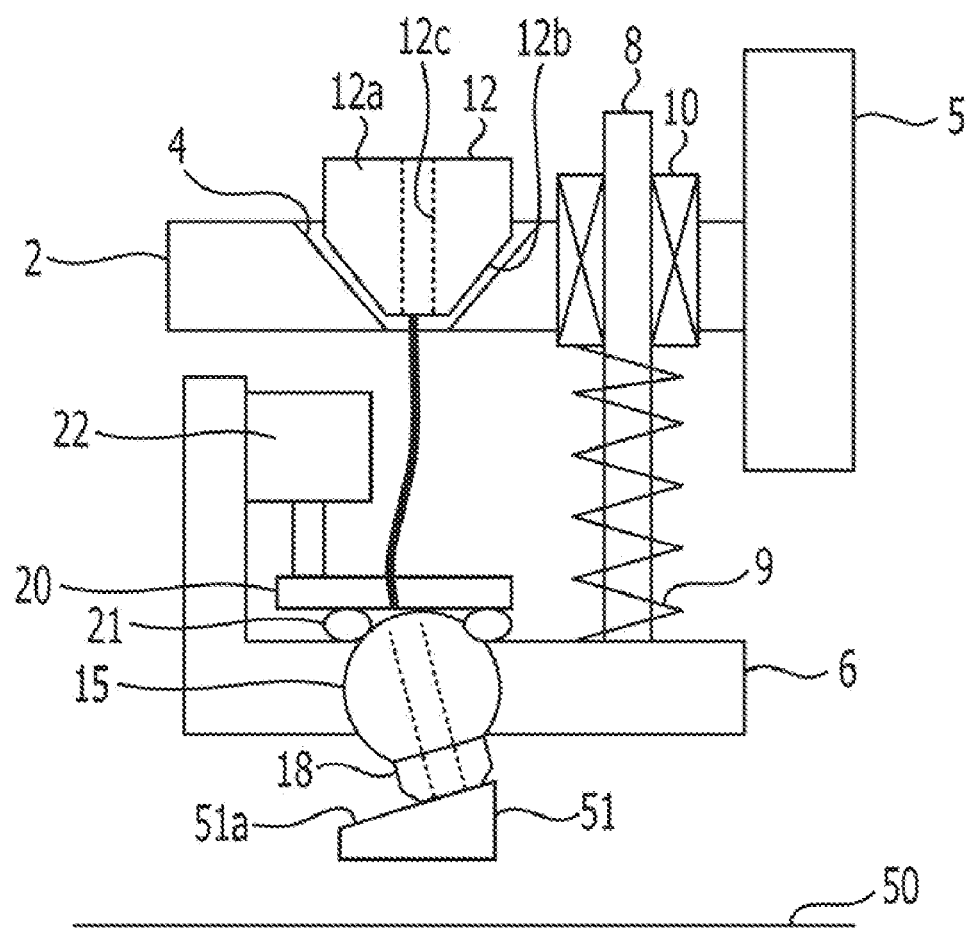
FIG. 16 shows the mounter apparatus raising the chip being suctioned.

After locking the spherical member 15, the mounter apparatus 1 pulls up the chip 51 being suctioned as shown in FIG. 16 and moves over the substrate 52 on which the chip 51 is to be mounted. At this time, the undersurface of the chip 51 is maintained horizontal.

Figure 17:
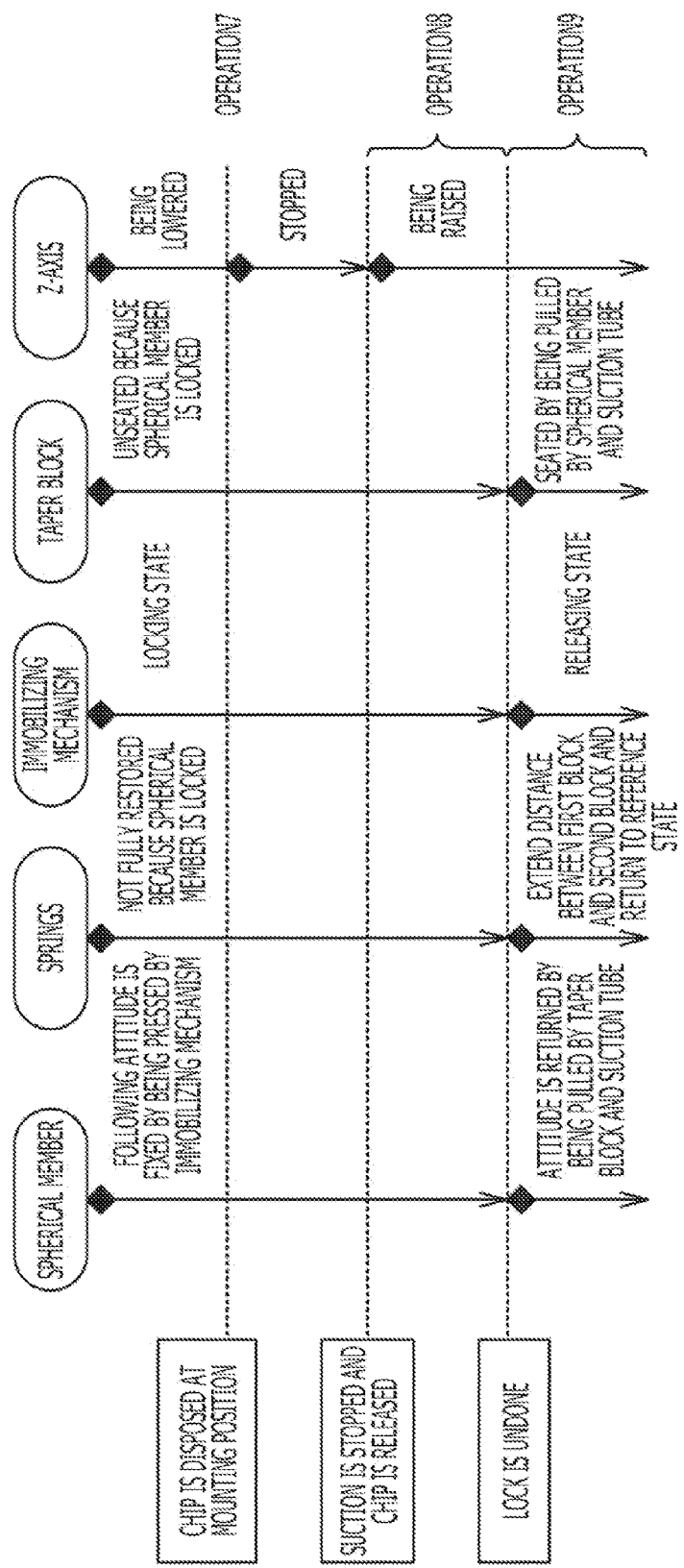
FIG. 17 shows the operation of the mounter apparatus during the mounting of the chip on a substrate.

Next, the process of releasing the chip 51 from the suctioned state and mounting it on the substrate 52 will be described with reference to a time chart shown in FIG. 17. The release of the chip 51 is started from the state of OPERATION 6. A brake is put on the spherical member 15 and the spherical member 15 is locked. The spring 9 is slightly compressed and is not fully restored. The taper block 12 can be unseated from the conical hole 4. The actuator 5 still maintains the lowered state.

Figure 18:
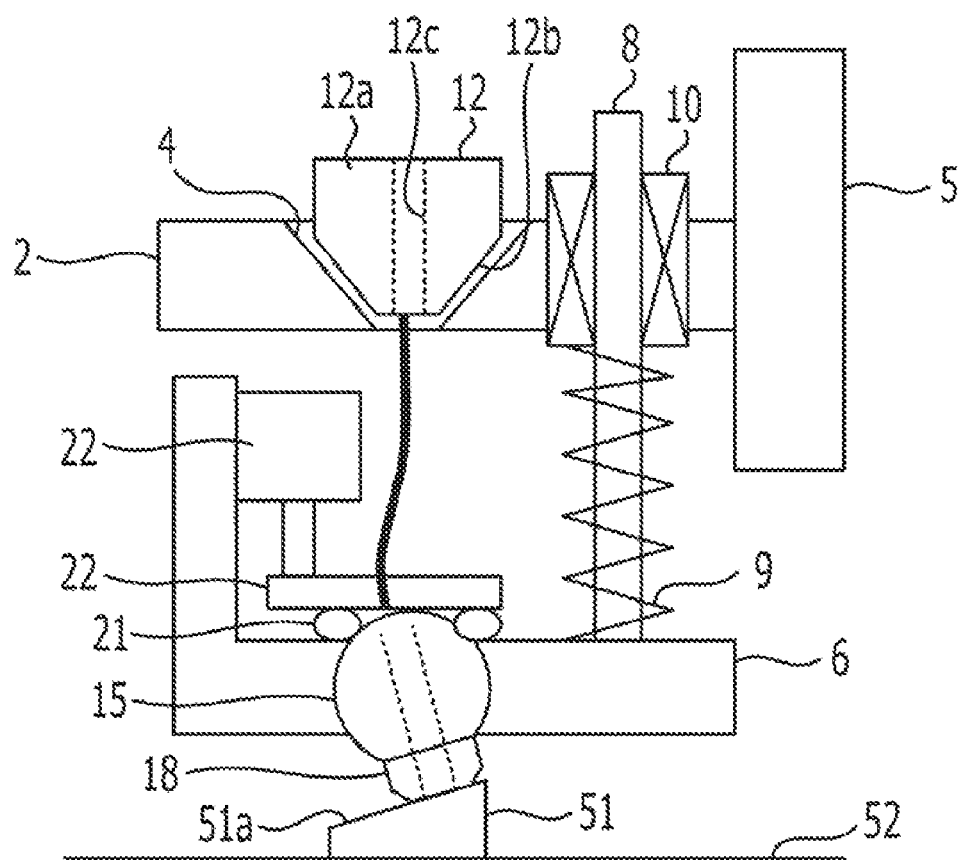
FIG. 18 shows the mounter apparatus that has placed the chip on the substrate.

While maintaining such a state, the mounter apparatus 1 disposes the chip 51 at a mounting position on the substrate 52 as shown in FIG. 18 (OPERATION 7). The mounter apparatus 1 then stops suctioning the chip 51 with the suction mechanism and releases the chip 51 from the suction nozzle 18 (suction head portion 14). Thus, the chip 51 is placed on the substrate 52.

Figure 19:
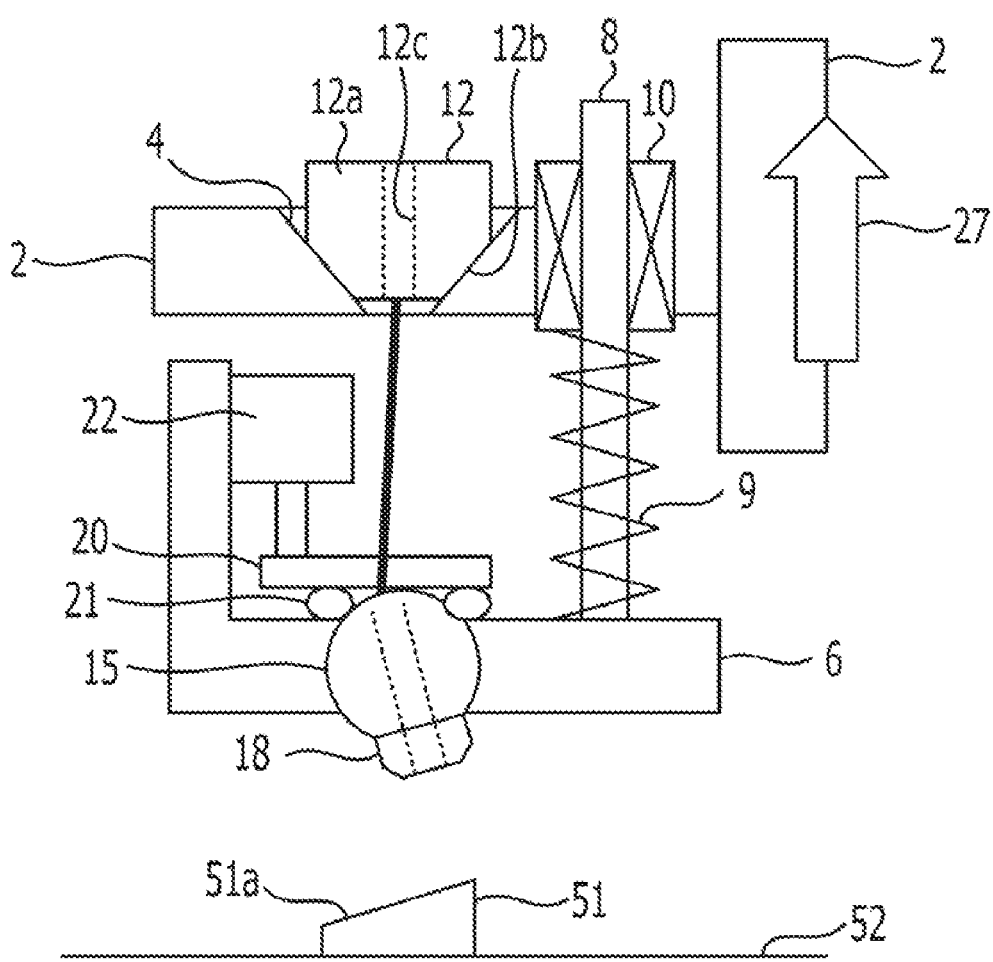
FIG. 19 shows the mounter apparatus that has released the chip and been raised with the spherical member locked.
Figure 20:
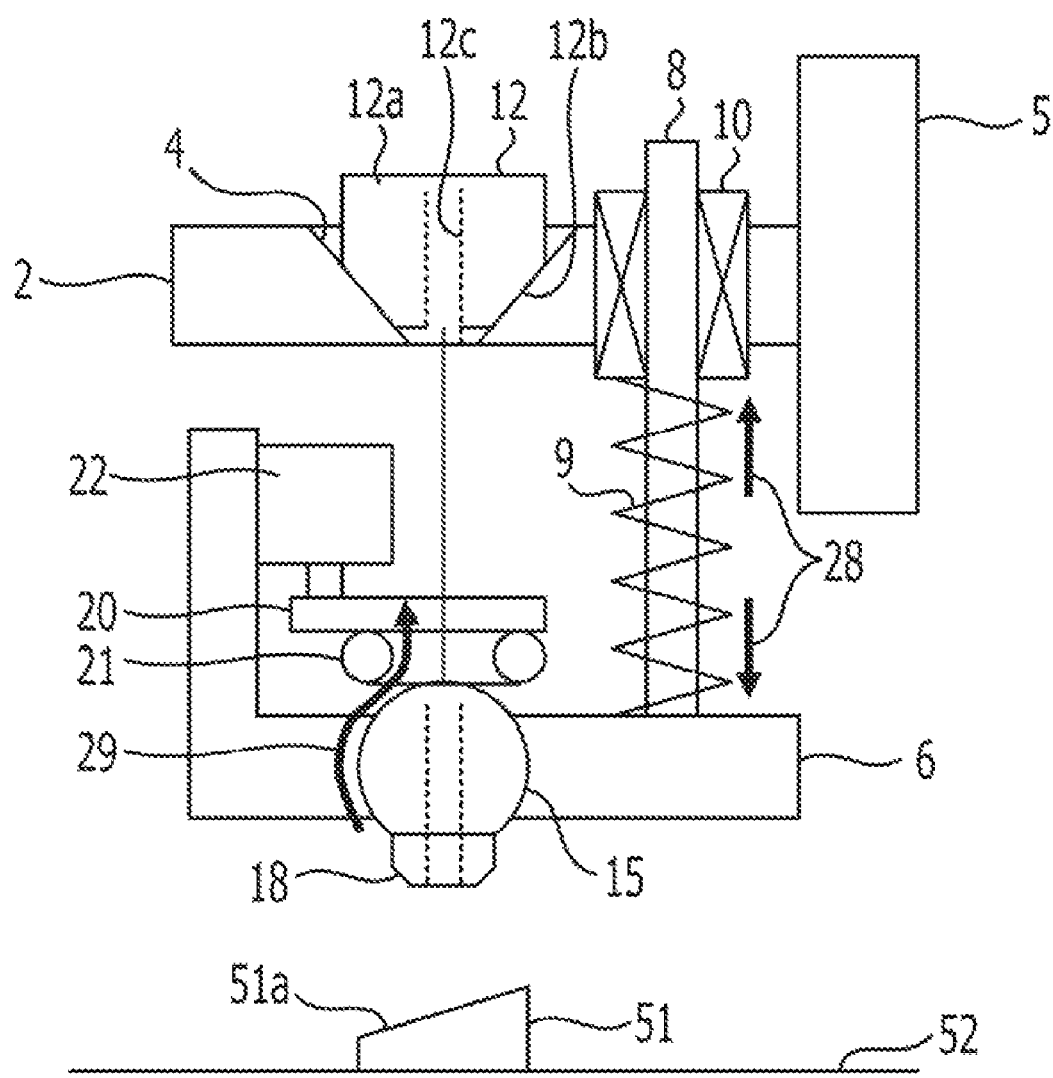
FIG. 20 shows the mounter apparatus the spherical member of which is unlocked.

After that, the mounter apparatus 1 raises the first block 2 with the actuator 5 as indicated by an arrow 27 in FIG. 19 (OPERATION 8). FIG. 19 shows a state where the spherical member 15 is still locked by the immobilizing mechanism and therefore the spherical member 15 is inclined. The mounter apparatus 1 then releases the immobilization of the suction head portion 14 by the immobilizing mechanism as shown in FIG. 20. When the actuator 5 raises the first block 2, the distance between the first block 2 and the second block 6 is extended by the elastic force of the spring 9 acting as indicated by arrows 28 in FIG. 20. Finally, the distance between the first block 2 and the second block 6 returns to the reference state. As described above, when moving the first block 2 by the restoring force of the spring 9, the mounter apparatus 1 moves the taper block 12 in the vertical direction at the same time (OPERATION 9).

When raised together with the first block 2, the taper block 12 is seated in the conical hole 4, and the axis of the taper block 12 becomes coincident with the axis AX of the conical hole 4. As the distance between the first block 2 and the second block 6 is extended, the spherical member 15 released from the locked state is pulled up by the suction tube 19 as indicated by an arrow 29 in FIG. 20. As a result, the spherical member 15 rotates, and the suction nozzle 18 attached to the spherical member 15 returns to the center position. The center position is the reference position of the suction nozzle 18, where the suctioning surface of the suction nozzle 18 is kept horizontal and the axis of the suction nozzle 18 coincides with the axis AX of the conical hole 4.

Thus, the mounter apparatus 1 of this embodiment can return the suction nozzle 18 to the reference state every time the operation to move a chip 51 is completed.

The mounter apparatus 1 of the above-described embodiment is configured to suction the chip 51 mainly by the operation in the vertical direction, and therefore the overall structure can be made compact. Because the operation in the vertical direction is mainly performed, even when other parts are mounted near the chip mounting position, interference with these parts can be avoided. In addition, the suction head portion 14 is returned to the horizontal position by the suction tube 19 that connects the taper block 12 held in the conical hole 4 provided in the first block 2 and the suction head portion 14 rotatably held by the second block 6. Such a structure can be made at low cost. The suction tube 19 extends vertically from the center of the taper block 12, and the suction head portion 14 is provided at the lower end thereof. Thus, the influence of the weight and tension of the suction tube 19 on the direction of the suction nozzle 18 can be reduced. Because the mounter apparatus 1 returns the suction nozzle 18 to the reference state when the operation to move a part is completed, the suction nozzle 18 can follow the inclination of the upper surface of the part when the suction nozzle 18 comes into contact with the part. Thus, the part can be reliably suctioned and breakage of the part is avoided.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Although the embodiments of the present inventions have been described in detail, it should be understood that various changes, substitutions, and alterations could be made hereto without departing from the spirit and scope of the invention.

What is claimed is:
1. A mounter apparatus comprising:
a first block disposed so as to be able to be reciprocated by an actuator in a first direction, the first block having a conical hole having a conical internal wall and an axis parallel to the first direction;
a second block disposed so as to face the first block and be held by the first block with an elastic body interposed between the first block and the second block, the second block moving by the actuator together with the first block in the first direction, the second block approaching the first block while compressing the elastic body, the second block moving away from the first block due to an elastic force of the elastic body;
a suction head portion rotatably held by the second block and including a suction nozzle on an opposite side from a side where the first block is disposed;
an immobilizing mechanism to immobilize the suction head portion and stop a rotational operation of the suction head portion;
a taper block having an external wall having a conical shape corresponding to a shape of the conical internal wall of the conical hole, the taper block placed in the conical hole; and
a flexible connecting member connecting the suction head portion and the taper block.
2. The mounter apparatus according to claim 1, wherein the position of the axis in a plane perpendicular to the first direction coincides with the position of a center of rotation of the suction head portion in the plane.
3. The mounter apparatus according to claim 1, wherein the connecting member is a suction tube that supplies suction force to the suction head portion.
4. A mounting method using a mounter apparatus including a first block having a conical hole having a conical internal wall, a second block disposed so as to face the first block, the second block being held by the first block with an elastic body interposed between the first block and the second block, a suction head portion being rotatably held by the second block and having a suction nozzle on the opposite side from the side where the first block is disposed, a taper block disposed in the conical hole, and a connecting member connecting the suction head portion and the taper block, the method comprising:
bringing the suction nozzle into contact with a surface suction of a part from a first direction with a center position of the suction nozzle kept;
moving the first block in the first direction toward the part, thereby compressing and deforming the elastic body and rotating the suction head portion according to the inclination of the surface suction;
causing the suction head portion to suction the part;
immobilizing the suction head portion and stopping the rotational operation of the suction head portion;
moving the first block suction to a specified position where the part is to be placed;
placing the part at the specified position;
separating the part from the suction head portion;
releasing the immobilization of the suction head portion;
moving the taper block in the first direction together with the first block using a restoring force of the elastic body; and
returning the suction nozzle to the center position using the movement of the taper block.
5. The mounting method according to claim 4, wherein the position of the axis of the conical hole in a plane perpendicular to the first direction coincides with a position of a center of rotation of the suction head portion in the plane.
6. The mounting method according to claim 4, wherein the connecting member is a suction tube that supplies a suction force to the suction head portion.

* * * * *